(12) United States Patent
Holcman et al.

(10) Patent No.: US 6,544,805 B2
(45) Date of Patent: Apr. 8, 2003

(54) METHOD FOR DETERMINING THE INTERNAL ORIENTATION OF A WAFER

(75) Inventors: Ido Holcman, Rehovot (IL); Alexander Shulman, Rehovot (IL); Jeffrey Danowitz, Tel Aviv (IL)

(73) Assignee: Nova Measuring Instruments Ltd. (IL)

(*) Notice: Subject to any disclaimer, the term of this patent is extended or adjusted under 35 U.S.C. 154(b) by 0 days.

(21) Appl. No.: 09/931,731

(22) Filed: Aug. 16, 2001

(65) Prior Publication Data

US 2002/0042153 A1 Apr. 11, 2002

(30) Foreign Application Priority Data

Aug. 30, 2000 (IL) .................................................. 138158

(51) Int. Cl.[7] .............................................. H01L 21/66
(52) U.S. Cl. ........................................................ 438/14
(58) Field of Search ..................... 33/10; 451/8; 438/14

(56) References Cited

U.S. PATENT DOCUMENTS 5,083,378 A * 1/1992 Juday ............................. 33/10
6,341,996 B1 * 1/2002 Brien ............................. 451/8

* cited by examiner

Primary Examiner—John F. Niebling
Assistant Examiner—Andre' C Stevenson
(74) Attorney, Agent, or Firm—Mayer, Brown, Rowe & Maw

(57) ABSTRACT

A method for determining the orientation of a pattern on the surface of an object relative to the object. The pattern comprises an array of generally perpendicular grid lines intersecting at grid junctions, and the object comprises a marker located at an edge thereof. The method comprises: determining the directions of the grid lines relative to the direction of the reference coordinate system, determining the direction of object's orientation axis relative to the direction of the reference coordinate system, and determining the orientation of the grid lines relative to the object's orientation axis. The step of determining the direction of object's orientation axis comprises the steps of determining a location of the geometrical center of the object in the reference coordinate system and detecting and determining a location of the marker in the reference coordinate system.

27 Claims, 4 Drawing Sheets

METHOD FOR DETERMINING THE INTERNAL ORIENTATION OF A WAFER

FIELD OF THE INVENTION

The present invention relates to semiconductor processing in general and to a method for determination of the internal orientation of a wafer in particular.

BACKGROUND OF THE INVENTION

As known in the art, semiconductor chips are usually manufactured from dies of a semiconductor wafer. The dies are formed by a grid of perpendicular scribe lines that are oriented to certain crystallographic axes on the silicon substrate of the wafer. The silicon wafer will eventually be cut along the scribe lines into dies, which are the individual semiconductor chips obtained from the wafer. Wafer orientation is usually measured with the help of a marker on the wafer, such as a flat or a notch, which is oriented to certain crystallographic axes on the silicon substrate. It is very important to align the grid of scribe lines with the respect to the orientation axis of the wafer, i.e. the line connecting the notch center and the geometrical center of the wafer. It is also important to align the grid of scribe lines with the respect to geometrical center of the wafer.

FIG. 1 illustrates a silicon wafer, generally referenced 10. Typically a wafer has a orthogonal grid of scribe lines 12 generally, forming a plurality of dies, such as die 13. Scribe lines 12 intersect at junctions, for example, junction 14. Wafer 10 is generally circular but includes a notch 15 or a flat (not shown) that serves as an orientation marker.

Prior art methods for determining the coarse orientation of the wafer typically include the step of detecting by employing an optical sensor the position of the notch 15 or of the flat of the wafer while the wafer is rotated. Such a method is described in U.S. Pat. No. 6,038,312 assigned to the assignee of the present application and hereby incorporated by reference.

There is another common approach for wafer alignment in semiconductor manufacturing that recognizes the patterned features on a wafer. Such a method is described in U.S. Pat. Nos. 5,682,242 and 5,867,590 assigned to the assignee of the present application, both hereby incorporated by reference. The method determines the coarse directions of the grid lines relative to the direction of a reference coordinate system, and detects a direction of one of a plurality of directional features on the wafer, thereby providing a location of the grid junction in the reference coordinate system.

While the aforementioned patents provide methods for determining the location and orientation of distinguishing features of standard semiconductor wafers, it would nonetheless be of significant advantage to the semiconductor industry to be able to precisely determine other orienting parameters of the wafer, such as the orientation of the grid lines of the wafer relative to the wafer itself (i.e., the "internal" orientation). It would also be of significant advantage to provide a method that enables locating the geometrical center of the wafer and of the wafer marker with an accuracy level that was previously unattainable.

It is therefore the primary object of the present invention to provide a method for determining the internal orientation of a wafer. It is also an object of the present invention to provide a method for determining the orientation of a wafer with increased accuracy. These and other objects of the present invention will become more apparent from the summary of the invention and detailed description of the drawings that follow.

SUMMARY OF THE INVENTION

There is a need in the art to facilitate inspection of the results of a photoresist exposure process, by providing a novel optical inspection method and system.

Generally speaking, there is a need for a technique capable of determining the internal orientation and location of a pattern on the surface of an object relative to the object itself.

Thus, the main idea of the present invention consists of determining of location of scribe lines relative to the geometrical center of the wafer and their orientation relative to the orientation axis of the wafer.

There is thus provided according to one broad aspect of the present invention a method for determining the orientation of a pattern on the surface of an object relative to the object, wherein the pattern comprises an array of generally perpendicular grid lines intersecting at grid junctions, and said object comprises a marker located at an edge thereof, the method comprising the steps of: determining the directions of the grid lines of the pattern relative to the direction of the reference coordinate system; determining the direction of object's orientation axis relative to the direction of the reference coordinate system; determining the orientation of the grid lines relative to the object's orientation axis; wherein said step of determining the orientation of the object's orientation axis comprises the steps of determining a location of the geometrical center of the object in the reference coordinate system and detecting and determining a location of said marker in said reference coordinate system.

In accordance with a preferred embodiment of the present invention, the step of determining the orientation of the grid lines comprises detecting a pair of directional features thereby providing a location of the feature in the coordinate system.

Further in accordance with a preferred embodiment of the present invention, one of the directional features is located proximate to the geometrical center of the object and another is located proximate to the edge portion of the object.

Moreover in accordance with a preferred embodiment of the present invention, the directional features are of the same type.

Additionally in accordance with a preferred embodiment of the present invention, the directional features are of different types.

Thus, according to another broad aspect of the present invention, there is provided a method for a method for determining the location of a pattern on the surface of an object relative to the object, wherein the pattern comprises an array of generally perpendicular grid lines intersecting at grid junctions, and the object comprises a marker located at an edge thereof, the method comprising the steps of: determining the directions of the grid lines relative to the direction of the reference coordinate system; determining a location of the geometrical center of the object in said reference coordinate system; calculating the displacement of the grid lines relative to geometrical center of the object.

In accordance with a preferred embodiment of the present invention, the displacement of the grid lines is calculated as the displacement between the geometrical center of the object relative to one of four grid junctions located adjacent to said geometrical center.

Further in accordance with a preferred embodiment of the present invention, the step of determining the location of the geometrical center of the object comprises obtaining at least three imaging frames spaced along edge portions of the object, obtaining coordinates corresponding to the outer edge of the object within said at least three frames using image processing and computing the geometrical center of the object using said coordinates.

Still further in accordance with a preferred embodiment of the present invention, said at least three imaging frames are equally spaced along edge portions of the object.

Moreover in accordance with a preferred embodiment of the present invention, said image processing comprises the use of optical filtering.

Additionally in accordance with a preferred embodiment of the present invention, said filtering is Gaussian filtering.

Further in accordance with a preferred embodiment of the present invention, said filtering is Sobel filtering.

Still further in accordance with a preferred embodiment of the present invention, said image processing in the step of obtaining coordinates corresponding to the outer edge of the object within said at least three frames uses image processing initiated from the outside boundary of said frames.

Moreover in accordance with a preferred embodiment of the present invention, the method further comprises providing a substantially reflective background under the outer edge of the object.

Additionally in accordance with a preferred embodiment of the present invention, the method further comprises providing a substantially non-reflective background under the outer edge of the object.

Further in accordance with a preferred embodiment of the present invention, the step of determining a location of said marker in said reference coordinate system comprises determining a location of a center of curve approximating said marker.

Still further in accordance with a preferred embodiment of the present invention, said curve is a curve of even order.

Moreover in accordance with a preferred embodiment of the present invention, said curve is a circle.

Additionally in accordance with a preferred embodiment of the present invention, said curve is an ellipse.

Further in accordance with a preferred embodiment of the present invention, said curve is a parabola.

Still further in accordance with a preferred embodiment of the present invention, the step of detection of said marker comprises analyze of coordinates of three points located on the edge portion of the object.

Moreover in accordance with a preferred embodiment of the present invention, the method further comprises the step of pre-aligning the object with respect to a reference coordinate system.

Further in accordance with a preferred embodiment of the present invention, the step of pre-aligning the object comprises determining the location of a marker on an edge of the object and rotating the object such that said marker is held at a predetermined measurement location with respect to said reference coordinate system.

Still further in accordance with a preferred embodiment of the present invention, the object is a semiconductor wafer.

Moreover in accordance with a preferred embodiment of the present invention, the grid lines are scribe lines between dies of said semiconductor wafer.

Additionally in accordance with a preferred embodiment of the present invention, the marker is a notch.

Further in accordance with a preferred embodiment of the present invention, the marker is a flat.

Still further in accordance with a preferred embodiment of the present invention, the pattern on the surface of semiconductor wafer is formed by photoresist.

Moreover in accordance with a preferred embodiment of the present invention, the step of determining the orientation of a pattern on the surface of an object relative to the object is performed after performing photoresist developing for first patterned layer.

BRIEF DESCRIPTION OF THE DRAWINGS

The present invention is herein described, by way of example only, with reference to the accompanying drawings, wherein.

DETAILED DESCRIPTION OF THE PRESENT INVENTION

The present invention provides a method for determination of the internal orientation of a wafer, i.e. location of scribe lines relative to the geometrical center of the wafer and their orientation relative to the orientation axis of the wafer.

It is appreciated that the detailed description that follows is intended to illustrate certain preferred embodiments of the present invention. It is in no way intended to limit the scope of the invention, as set out in the claims.

Figure 2:
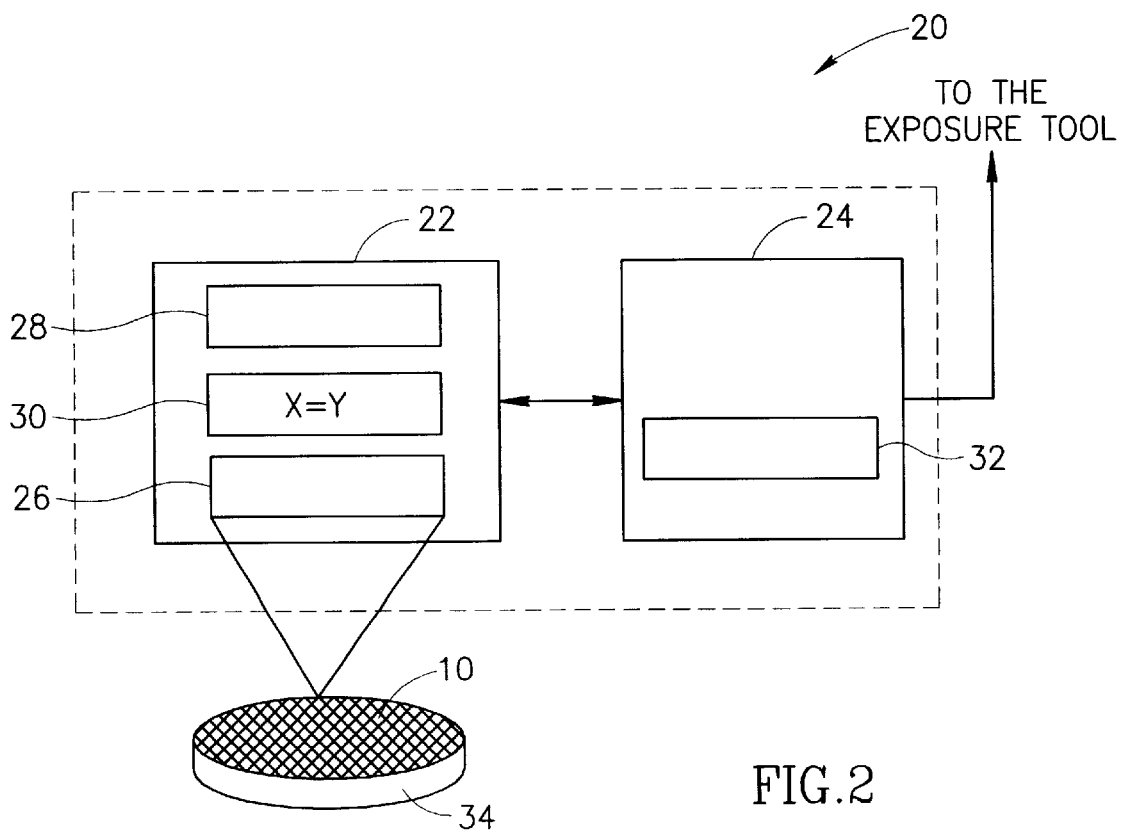
FIG. 2 is a block diagram of the main components of the measurement system.

Reference is now made to FIG. 2, which is a schematic block diagram illustration of a system for determining the internal orientation of the wafer constructed and operative in accordance with a preferred embodiment of the present invention. The system, generally referenced 20, comprises an optical system 22 and a control unit 24, which controls the movement and image acquisition of the optical system 22 and image processing.

Optical system 22 typically comprises an optical unit 26 providing desired optical resolution, a camera 28 (e.g. CCD) for image acquisition and a translation system 30, such as an X-Y stage. An image processing unit 32 forming a part of the control unit 24. It will be appreciated that translation system 30 provides moving of at least some of the optical elements of the optical system 22 in two dimensions thereby moving field of view of the optical system 22 enabling viewing of entire wafer 10 while located on a stage 34. It should be noted that stage 34 might also be rotatable or movable. Optical system 22 may be separated from the wafer by transparent window (not shown).

Control unit 24 could be on the base of computer including necessary utilities for performing necessary functions.

Optical unit 26 preferably comprises a light source, such as a Xenon or a Halogen lamp (not shown), for illuminating the surface of the wafer, an objective for providing a desired optical magnification and, optionally, a focusing assembly (not shown) for providing a sharp focused image in the camera 28. Such systems are known in the art and do not need further detailed description.

According to one preferred embodiment of the present invention the system 20 operates to determine a desired internal position of wafer 10. An image of a selected portion of the wafer 10, preferably of a relatively small area thereof, determined by the optical unit 26 is sensed by the camera 28 and is provided to the control unit 24 via necessary interface and processing units. Control unit 24 analyzes the images and adjusts the position of the moving optical unit 26 by moving the X-Y stage 30 (and/or stage 34). The process, which is described in more detail hereinbelow, is then repeated until the desired parameters are found.

As shown in FIG. 2, the control unit 24 is connectable to the exposure tool thereby enabling to utilize the determined internal orientation of a wafer for carrying out a closed loop control of the pattern-creating tool (exposure tool). The analysis of the obtained data is indicative of the quality of the wafer alignment during the exposition, and consequently, indicative of the quality of the pattern-creation process defined by the working parameters of the exposure tool. Hence, the measurement results may be used for the so-called "feed forward" closed loop control of these working parameters prior to applying the tool to a further similar wafer (i.e., the same-lot-wafer).

Reference is now made to FIG. 3A which is a flow chart illustrating a method for determining the internal orientation of a wafer.

Figure 3:
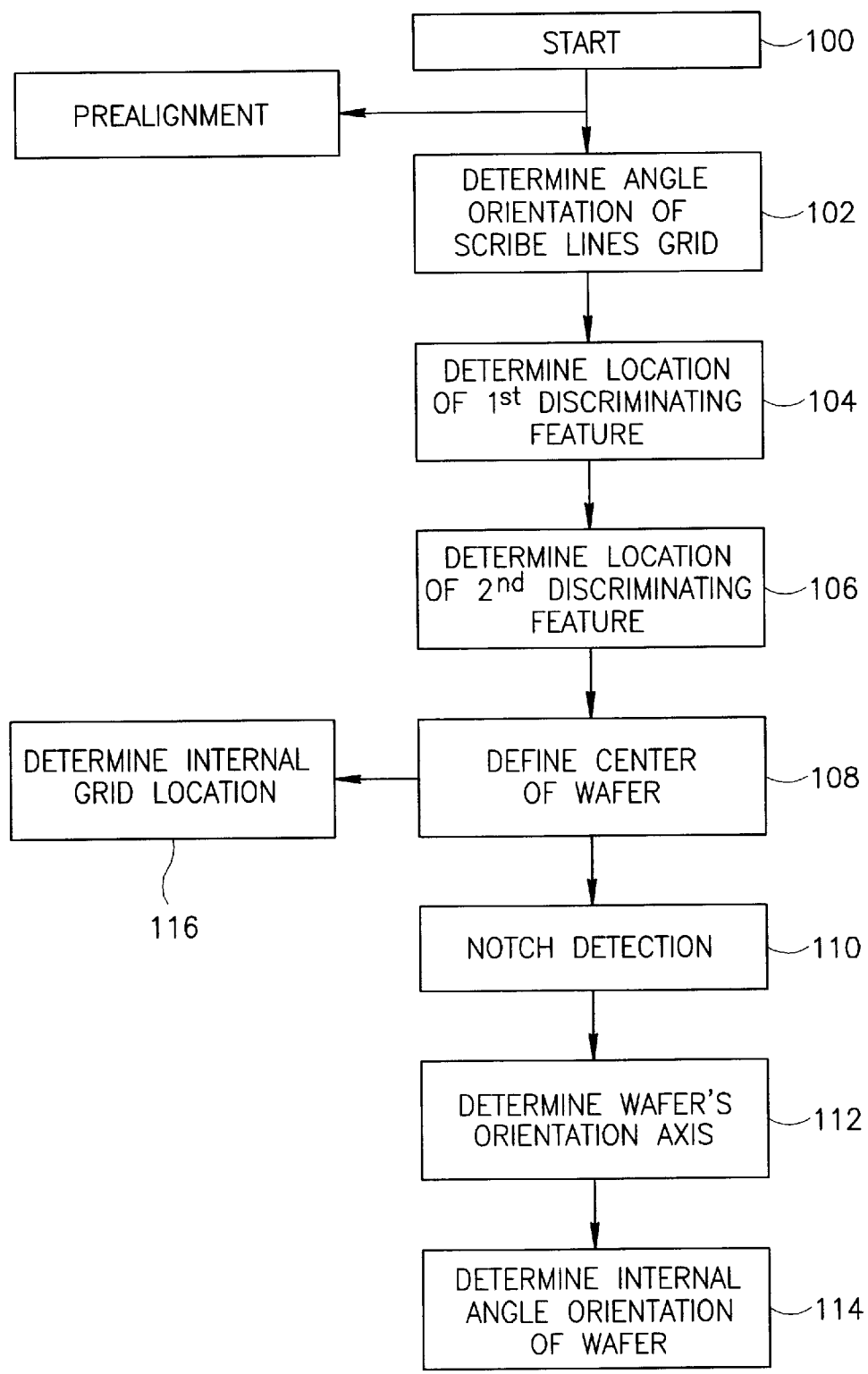
FIG. 3 is a flow chart illustration of a method for precise determination of the internal orientation.

The flow chart of FIG. 3 illustrates a method of employing the system of FIG. 2, in accordance with a preferred embodiment of the present invention.

In order to perform the method of FIG. 3A, the wafer 10 is positioned, for example manually or by appropriate robot assembly (not shown) on stage 34 of the system 20. Such a positioning provides the center of wafer 10 with an inaccuracy up to 1 mm with respect to stage 34. Moving optical unit 26 is then positioned above the central area of the wafer 10, and the method according to the present invention is initiated as indicated by block 100. It should be noted that the X-Y stage 30 is provided by a coordinate system, that is preferably a Cartesian coordinate system having its origin coincident with the center of stage 34.

According to the method of FIG. 3A, the main directions of silicon wafer 10, i.e. angle orientation of the scribe lines grid are determined first (step 102), preferably relative to the stage coordinate X-Y system. The orientation may be expressed as an angle $\alpha$ of rotation of the grid relative to the stage coordinate system (see FIG. 1). The relative angle orientation $\alpha$ of the scribe lines relative to the stage coordinate system may be determined by any suitable method which employs the fact that most of the elements on the wafer surface are bounded by lines which are generally straight and are generally parallel to the main directions of the silicon wafer 10.

According to one embodiment of the present invention, a Hough transform is employed on the grabbed image to obtain the content of the lines at any selected direction, thereby to detect which lines are scribe lines.

Figure 4:
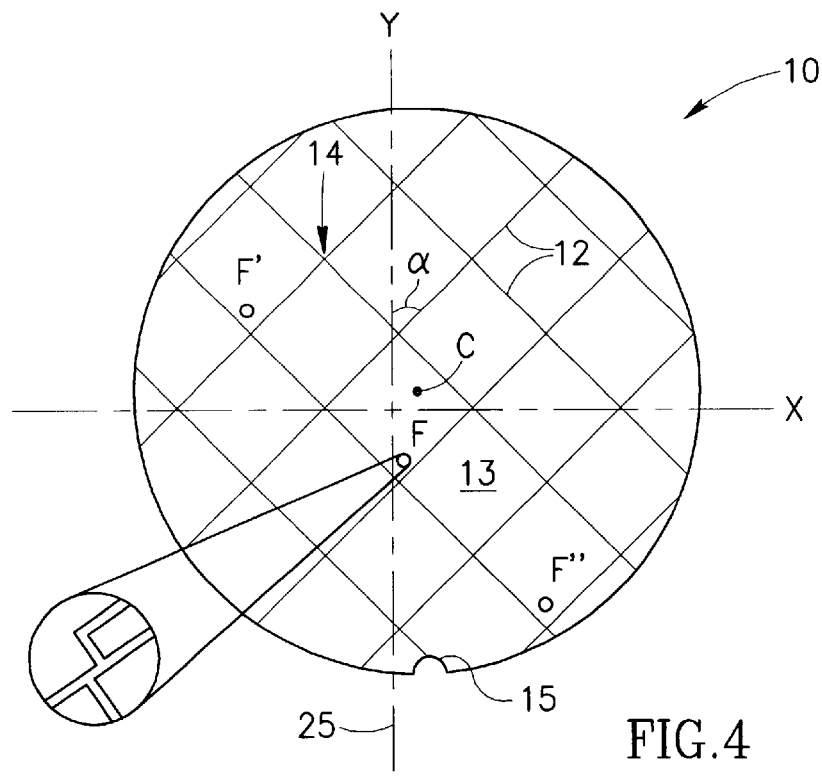
FIG. 4 is schematic illustration of the silicon wafer of FIG. 1 with discriminating features thereon.

Reference is now made to FIG. 4 which is a schematic illustration of the wafer with so a so-called "discriminating features" F and F' thereon, shown in the blow up illustration 11. Since the line bounding the same discriminating features of the different dies located in the same column or line of dies is parallel or perpendicular to the scribe lines, it may be used for determining the orientation of the grid with desired accuracy. To this end, in accordance with the step 104 (of FIG. 3) the coordinates of pre-determined discriminating features F may be determined in accordance with the above mentioned U.S. Pat. Nos. 5,682,242 and 5,867,590, hereby incorporated by reference.

Preferably, in accordance with the step designated 106, the coordinates the same discriminating feature F' located in the die of the same column or line of dies are determined with desired accuracy. Step 106 may be performed by moving the optical unit 26 to the vicinity of the second discriminating feature F' and determining its location with the desired accuracy. Moving of the optical unit 26 is performed on the base of information on die size, feature's location within the die and coarse orientation of the grid of scribe lines, determined during the step 102. Using the coordinates of these two discriminating features F and F' the fine orientation of the line bounding thereof and i.e. fine orientation of the grid may be calculated in the stage coordinate system. It should be noted, that the accuracy of this step is defined the optical resolution of the optical unit 26 and the distance between the discriminating features on the wafer. Thus, pair of discriminating features F' and F" located on the opposite sides of the wafer could provide better accuracy. It should be noted, that it is possible to calculate fine orientation of the grid in the stage coordinate system using the same discriminating features of dies arbitrary located on the wafer surface or using at least two different discriminating features.

According to one preferred embodiment, prior to the loading the wafer 10 on the stage of the system for determining the internal orientation of the wafer the step of angular pre-alignment may be performed. This step may be performed using the marker (hereinafter, preferred embodiments will be described with reference to a notch 15 though it is appreciated that the marker need not be a notch, but may also be a flat). Pre-alignment may be accomplished through any known technique in the art, such as e.g. a technique disclosed in the above-mentioned U.S. Pat. No. 6,038,029. In accordance with above technique, coarse location of the notch 15 is determined using rotation of the wafer and detecting the notch by opto-couple detector. The wafer may be rotated into desired position or control unit 24 could be provided with information on notch location in pre-determined coordinate system, e.g. coordinate system of the stage. In that case, the search of the first discriminating feature F could be performed more easily and quickly. In order to find the discriminating feature F, after performing step 102, it may be necessary to move optical unit 26 into four expected locations within the adjacent die, since there are four possible orientations of the die. When the pre-alignment is performed, it is not necessary to perform coarse orientation determining of the grid of scribe lines (step 102). In that case, the only one movement of optical unit 26 should be performed, since the location of the discriminating feature F relative to the initial position of the optical system 26 is known (approximately). It should be noted, that the pre-alignment step may be performed using rotation of stage 34 and appropriate optical sensor, including optical unit 26.

It is readily appreciated that step of determining the orientation of the grid may be performed in a number of subsequent steps each with increasing accuracy. It could be implemented by use of optical system having coarse and fine resolution. It is appreciated that the resolution of the optical system may be selected by the user based on the desired accuracy level. Coarse alignment could be implemented by relatively low magnification optics and fine one by use of optics with higher magnification accordingly.

It is further appreciated that the aforementioned step does not provide an exact determination of the location of the wafer's center. A substantially exact determination of the center will be achieved in a later step to be described.

Once the direction of the scribe lines is determined, the geometrical center of the wafer is detected. It is appreciated that in many cases, the actual geometrical center of the wafer differs from the center of the reference coordinate system (in FIG. 1, said geometrical center is designated C and the distance between said geometrical center C and the center of the reference coordinate system O has been increased for emphasis and clarification), since the initial placement of the wafer onto the coordinate system has an inaccuracy of about 1 millimeter. It is appreciated that in the prior art methods, only a general determination of the geometrical center of the wafer could be made.

Figure 5:
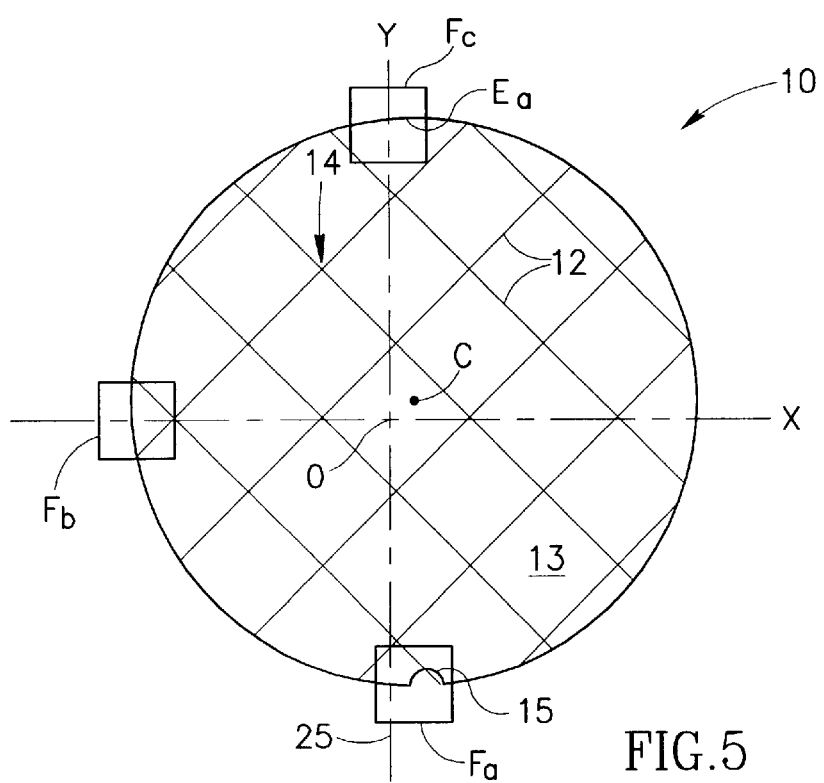
FIG. 5 is a schematic illustration of the silicon wafer of Fig. 1, also illustrating imaging frames for detecting the edges, and thereafter, the geometrical center of a wafer, according to a preferred embodiment of the present invention.

To this end, the method continues in step 108 by performing moving the field of view of optical system 22 to capture edge portion of wafer 10. Reference is now made to FIG. 5. As exemplified in FIG. 5, at least three imaging frames (Fa, Fb, Fc) are used to capture edge portions (for example, edge portion Ea) of the wafer 10. One of the imaging frames includes the marker (for example, notch 15) of the wafer 10. On the basis of the images received from the imaging frames, the edges of the wafer 10 are detected and the coordinates for geometrical center C are calculated.

It is appreciated that by increasing the number of imaging frames, the geometrical center can be determined with higher accuracy. It is further appreciated that the number of frames used is according to the accuracy level that is needed. For example, in order to cover the entire edge perimeter of 200 mm wafer using 40×40 mm field of view, fourteen imaging frames are needed.

Detection of the wafer edge may be accomplished through any appropriate means, such as by employing Gaussian and/or Sobel filters to obtain filtered images of each frame. The coordinates of each frame pixel as well as the location of the frame and the approximate location of the wafer edge are known for each imaging frame. The edge portions are detected by using a substantially non-reflective (black) background that appears in the filtered image as a substantially homogenous background. Portions of the wafer 10 appear an area having a distinctive gray-level (homogenous, or non homogenous, for patterned wafers). The edge is detected by using the gradient of the gray-level (above a predetermined threshold) that is closest to the non-reflective background. Since the approximate location of the edge relative to the boundaries of the frame is known, the image processing could be initiated from the outside boundary of the frame towards the proposed position of the edge. In that case, the first pixel having distinction from the background (above pre-determined threshold) gray level is defined as an edge.

It is appreciated that it is possible in some cases to provide a substantially reflective background behind the wafer in order to improve accuracy of edge detection. The problem arises from that fact that the wafer edge is not sharp enough and has some curvature that is not constant over the wafer perimeter. The radius of curvature may be up to 0.5 mm. The focus problem may cause relatively high inaccuracy in the edge determination. Use of sharply contrast background, such as mirror or black background may increase the accuracy of the edge detection.

Once the perimeter edge points are located, said points are converted into coordinates for subsequent use in determining the wafer geometrical center C.

It is appreciated that there are various appropriate techniques that may be used to determined the geometrical center of the wafer using the edge coordinates. For example, Cesaro sums may be employed for determining the centroid of the closed area given by the wafer. In this embodiment, the greater the number of frames used in step 108, the greater the accuracy achieved. Using four frames positioned at 90° intervals (as illustrated in FIG. 5), an accuracy of approximately 0.75 $\mu$m is achieved (with subpixeling, said accuracy increases to approximately 0.1250 $\mu$m). Using fourteen frames (covering the entire perimeter of the wafer), an accuracy of approximately 0.4 $\mu$m is achieved (with subpixeling, said accuracy increases to approximately 0.0667 $\mu$m). Since using the Cesaro sums relies only on a subset of edge points, it may be desirable to use another method.

Alternatively, geometric algorithms may be employed for finding the center of a circle having random sets of point triplets (taken from the wafer edge). As the number of sets taken increases, the average of the centers obtained converges to the actual geometrical center of the wafer.

Another approach employs elliptical fitting methods (taking into account the slight elliptical shape of the wafer). The advantage to using ellipse methods is that the actual radius and a measure of the elliptical extent of the wafer can be determined, along with the geometrical center of the wafer. A review of ellipse methods may be found in:

Andrew W. Fitzgibbon, Maurizio Pilu, Romert Fischer. *Direct Least Squares Fitting of Ellipses*. Department of Artificial Intelligence, The University of Edinburgh, Scotland: Departmental Report. 1–15, Jan. 4, 1996.

It is noted that frame pixels from the notch 15 are not used for calculation of the geometrical center of the wafer C.

In step, designated 110 of a method according to a preferred embodiment of the present invention, notch 15 is identified. The identification may be accomplished through any appropriate approach, e.g. using imaging frame Fa containing the notch 15, as shown in FIG. 5. The wafer notch size is approximately 3.5×1.5 mm (about 90×30 pixels). Different techniques may be used for exact notch detection.

Figure 6:
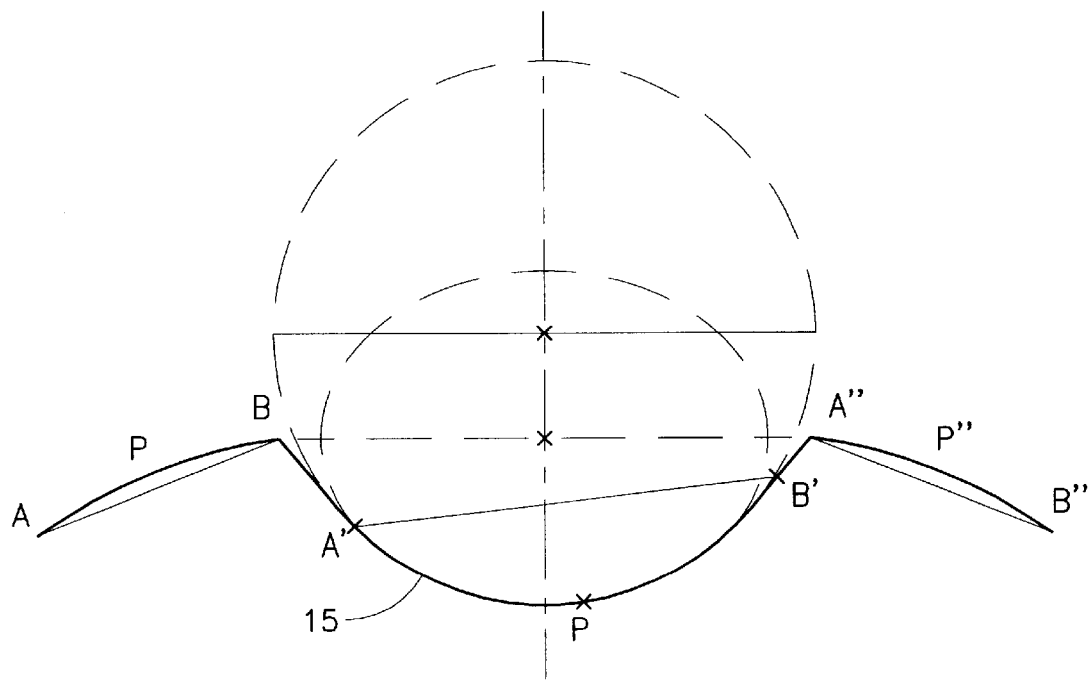
FIG. 6 schematically illustrate enlarged imaging frame Fa of FIG. 5.

Preferably, a technique using a geometric approach may be used for finding points of notch 15. Applying the technique similar to that used in the step 108 of the present invention, the coordinates of edge portion including the notch 15 may be defined. It is clear that notch points are the points that severely fall into the convex hull of the wafer's edge portion. In order to define the notch points, the following algorithm could be applied. Coordinates of three points A, B and P located on the edge portion of the wafer, as shown on FIG. 6, are analyzed while successively shifted along the edge curve. There are two possible locations of the central point P relative to the directed line segment connecting the outside points A and B. In accordance with FIG. 6 example, each point P that is to the right of the line segment belong to the notch 15 and points that are to the not to the right thereof, do not belong thereto. Preferably, the line segment should be longer than the notch 15 size, e.g. 90 pixels in our case.

Alternatively, the radius r of the wafer may be robustly calculated using information on the coordinates of the wafer's center C defined through the previous steps. Each point whose distance from the center of the wafer C is not within a pre-determined tolerance to the radius r of the wafer to be "Notch points".

After the wafer notch 15 is identified, the calculation of angle orientation β of wafer orientation axis relative to the stage coordinates, i.e. line passed trough the center point C of the wafer and center of the notch 15 is performed. During this step, designated 112, information on wafer's center C coordinates defined trough the previous steps are used. It should be noted, that it is simpler to accurately determine the point, which is the center of a curve forming the notch 15, rather than to define the center of the notch 15 itself. Reference is made to FIG. 6, which illustrate different techniques used to determine the center of a curve forming the notch 15 in accordance with the present invention. Preferably, the circle approximation based on the above-mentioned technique "*Direct Least Squares Fitting of Ellipses*" may be used. The coordinates of the center of the circle may be readily calculated.

In accordance with another preferred embodiment of the invention, approximation the notch points to an ellipse based on the above-mentioned technique may be used. In that case, the covariance matrix of the notch points is created. The major axes of the ellipse are determined using so-called eigenvectors technique. The point of the major axis intersection, i.e. center of the ellipse is further used for determination of the orientation axis of the wafer.

It should be noted, that number or different techniques may be used in order to determine the second point belonging orientation axis of the wafer. For example, an approximation the notch to a parabola or any other appropriate curve of even order may be used in order to find the central or middle point of the notch 15 alternatively to the above-mentioned techniques.

Figure 1:
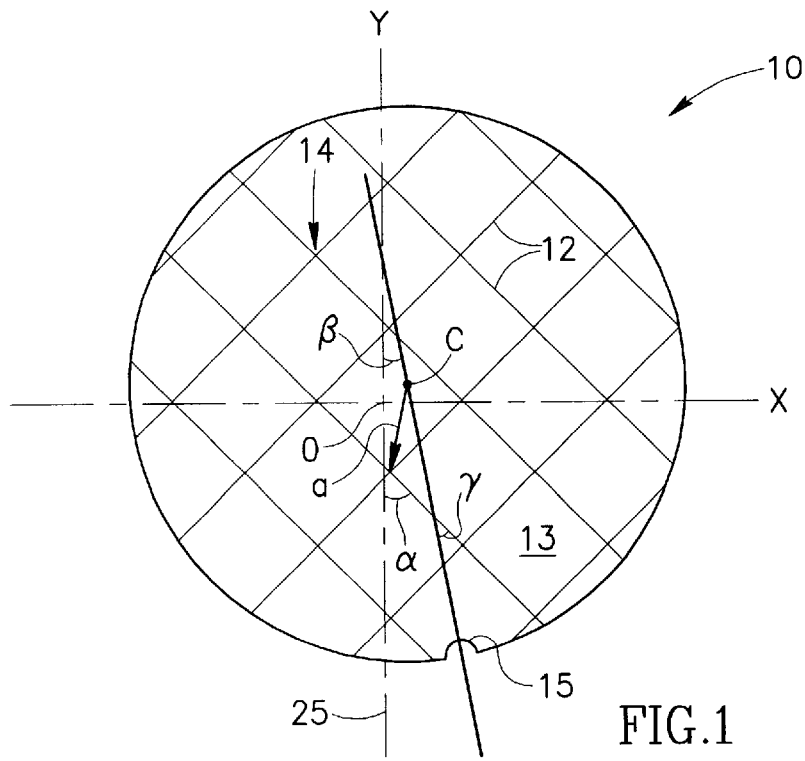
FIG. 1 is a schematic illustration of a silicon wafer.

Finally, the angle orientation γ, as shown on FIG. 1, of the grid lines 12 relative to the orientation axis of the wafer defined trough the previous step 112 is performed during step designated as 114 on FIG. 3. Since the angle orientation a of the grid lines relative to the coordinate X-Y system is defined trough the step 108, the angle orientation γ may be calculated using these two angles α and β, or through the analytic formulas representing these lines in the X-Y system.

Additionally, after performing the step 114 or alternatively next to the step 108, step 116 the vector between the geometrical center C of the wafer a and one of four grid junctions adjacent to the geometrical center of the wafer (for example, vector a of FIG. 1) may be determined. As illustrated in FIG. 1, the vector a between the geometrical center C and bottom left corner of the die, comprising the center point C is defined. For that purpose, the coordinates x and y of the die's corner should be defined additionally or while performing the step 108. The vector a then is defined using the coordinates of its end points. The value of the vector a is indicative of optimal distribution of the dies on the wafer and may be used for photolithography processing control. In case of non-optimal dies' distribution, the wafer could be re-worked or an appropriate correction of exposure tool operation could be performed.

Figure 7:
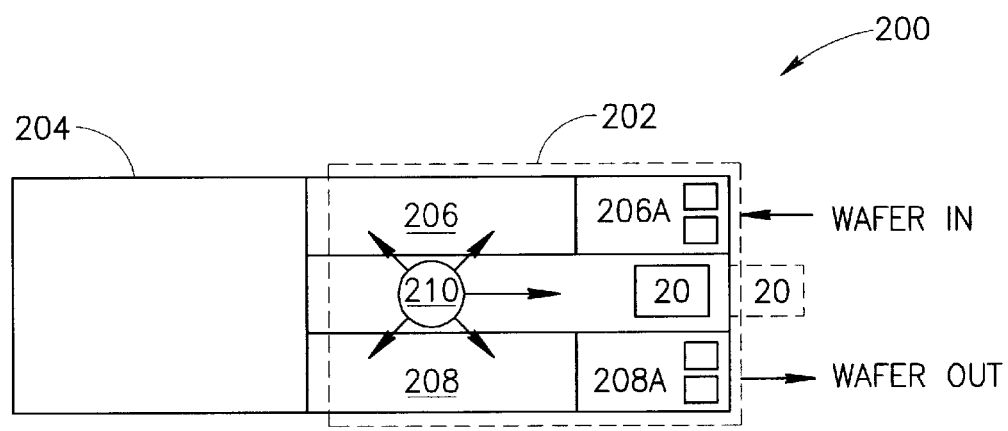
FIG. 7 schematically illustrates a part of a production line including a photolithography tool arrangement that utilizing a measurement system for carrying out a method of the invention.

Reference now is made to FIG. 7, which is a schematic illustration of apparatus set-up of photocluster tools performing a photolithography process in a semiconductor fabrication plant (Fab) in accordance with one preferred embodiment of the invention. The photocluster (or link) 200 is composed of two main parts: the phototrack 202, and the exposure tool 204. The phototrack includes a coater track 206 having a cassette load station 206a, and a developer track 208 having a cassette unload station 208a. Alternatively, both coater and developer functions may be combined and realized in the same stations (not shown). The wafers to be processed are located in the cassette station 206a. In addition to the common used tools, photocluster (or link) 200 in accordance with the present invention, includes system 20 for determining the internal orientation of the wafer. Preferably, the system 20 accommodated within the photocluster 200 or alternatively proximate thereto for providing so called "integrated metrology". A robot 210 provides transferring of the wafers between the tools within the photocluster 200. An operation of photocluster 200 tools is well known and does not need further description. By desirably repeating photolithography processes, a multi-level semiconductor wafer is produced.

It is very important to align the grid of scribe lines, i.e. dies itself with the respect to the orientation axis of the wafer that is oriented to certain crystallographic axes of the silicon substrate of the wafer. It is especially crucial while the first patterned layer on the surface of the wafer is created since the patterns of all consequent layers are oriented in accordance with the first patterned layer. It is also important to align the grid of scribe lines, i.e. dies with the respect to geometrical center of the wafer in order to obtain optimal distribution of the dies on the wafer's surface.

Preferably, the determination of the internal orientation of a wafer is performed in accordance with the present invention, after performing the photo-resist developing process applied to the first (underneath) layer.

Alternatively, the determination of the internal orientation of a wafer may be performed after performing the etching process applied to the first (underneath) layer.

It is apparent that in such a complex and delicate production process as photolithography, various problems, including failures or defects of alignment may arise or develop during each step, or from the serial combination of steps. Because of the stringent quality requirements, any problem, which is not discovered in time may result in the rejection of a single wafer, or of the whole lot. To this end, determination of the internal orientation of an initial (e.g.) first wafer of the lot may be performed before beginning or completing processing of other wafers in the lot. Therefore, an approach based on integrated monitoring, i.e., a monitoring apparatus physically installed inside or attached to the production unit, dedicated to it, and using its wafer handling system. Such integrated monitoring can provide tight, fast-response and accurate monitoring of each of the steps, as well as complete and integrated process control for the overall semiconductor production process, in general, and for photolithography, in particular.

While the invention has been described with respect to several preferred embodiments, it will be appreciated that these are set forth merely for purposes of example, and that many other variations, modifications and applications of the invention may be made, for example, the determination of the internal orientation of a wafer could be performed using stand-alone measuring systems.

What is claimed is:

1. A method for determining the location of a pattern on the surface of an object relative to the object, wherein the pattern comprises an array of generally perpendicular grid lines intersecting at grid junctions, and said object comprises a marker located at an edge thereof, the method comprising the steps of:

determining the directions of said grid lines relative to the direction of the reference coordinate system;

determining a location of the geometrical center of the object in said reference coordinate system; and calculating the displacement of said grid lines relative to geometrical center of the object;

wherein said displacement of said grid lines is calculated as the displacement between the geometrical center of the object relative and one of four grid junctions located adjacent to said geometrical center.

2. The method according to claim 1, wherein the step of determining the location of said geometrical center of the object comprises obtaining at least three imaging frames spaced along edge portions of the object, obtaining coordinates corresponding to the outer edge of the object within said at least three frames using image processing and computing the geometrical center of the object using said coordinates.

3. The method according to claim 2, wherein said at least three imaging frames are equally spaced along edge portions of the object.

4. The method according to claim 3, wherein said image processing comprises the use of optical filtering.

5. The method according to claim 4, wherein said filtering is Gaussian filtering.

6. The method according to claim 5, wherein said filtering is Sobel filtering.

7. The method according to claim 2, wherein said image processing in the step of obtaining coordinates corresponding to the outer edge of the object within said at least three frames using image processing is initiated from the outside boundary of said frames.

8. The method according to claim 7, further comprising providing a substantially reflective background under the outer edge of the object.

9. The method according to claim 7, further comprising providing a substantially non-reflective background under the outer edge of the object.

10. The method according to claim 9, wherein the step of determining a location of said marker in said reference coordinate system comprises determining a location of a center of a curve approximating said marker.

11. The method according to claim 10, wherein said curve is a curve of even order.

12. The method according to claim 11, wherein said curve is a circle.

13. The method according to claim 11, wherein said curve is an ellipse.

14. The method according to claim 11, wherein said curve is a parabola.

15. The method according to claim 14, wherein the step of detection of said marker comprises analysis of the coordinates of three points located on the edge portion of the object.

16. A method for determining the orientation of a pattern on the surface of an object relative to the object, wherein the pattern comprises an array of generally perpendicular grid lines intersecting at grid junctions, and said object comprises a marker located at an edge thereof, the method comprising the steps of:

determining the directions of said grid lines relative to the direction of the reference coordinate system;

determining the direction of object's orientation axis relative to the direction of the reference coordinate system;

determining the orientation of said grid lines relative to said object's orientation axis;

wherein said step of determining the direction of object's orientation axis comprises the steps of determining a location of the geometrical center of the object in said reference coordinate system and detecting and determining a location of said marker in said reference coordinate system; and pre-aligning the object with respect to a reference coordinate system.

17. The method according to claim 16, wherein the step of pre-aligning the object comprises determining the location of a marker on an edge of the object and rotating the object such that said marker is held at a predetermined measurement location with respect to said reference coordinate system.

18. A method for determining the orientation of a pattern on the surface of an object relative to the object, wherein the pattern comprises an array of generally perpendicular grid lines intersecting at grid junctions, and said object comprises a marker located at an edge thereof, the method comprising the steps of:

determining the directions of said grid lines relative to the direction of the reference coordinate system;

determining the direction of object's orientation axis relative to the direction of the reference coordinate system;

determining the orientation of said grid lines relative to said object's orientation axis;

wherein said step of determining the direction of object's orientation axis comprises the steps of determining a location of the geometrical center of the object in said reference coordinate system and detecting and determining a location of said marker in said reference coordinate system; and wherein said object is a semiconductor wafer.

19. The method according to claim 18, wherein said grid lines are scribe lines between dies of said semiconductor wafer.

20. A method according to claim 19, wherein the marker is a notch.

21. A method according to claim 19, wherein the marker is a flat.

22. The method according to claim 19, wherein the pattern on the surface of semiconductor wafer is formed by a photoresist.

23. The method according to claim 22, wherein said photoresist is developed for manufacturing the first patterned layer of the semiconductor wafer.

24. The method according to claim 16, wherein said step of determining the orientation of the grid lines comprises detecting a pair of directional feature thereby providing a location of said features in said coordinate system.

25. The method according to claim 24, wherein one of said directional features is located proximate to the geometrical center of the semiconductor wafer and another is located proximate to the edge portion thereof.

26. The method according to claim 24, wherein said directional features are of the same type.

27. The method according to claim 24 wherein said directional features are of a different type.

* * * * *